US005497402A

United States Patent [19]
Pyo et al.

[11] Patent Number: 5,497,402
[45] Date of Patent: Mar. 5, 1996

[54] AUTOMATIC FREQUENCY CONTROL DEVICE FOR SATELLITE COMMUNICATIONS GROUND SYSTEM

[75] Inventors: Cheol S. Pyo; Jin H. Jo; Jae I. Choi, all of Daejeon, Rep. of Korea

[73] Assignees: Electronics and Telecommunications Research Institute; Korea Telecommunications Authorities, both of Rep. of Korea

[21] Appl. No.: 357,455

[22] Filed: Dec. 16, 1994

[30] Foreign Application Priority Data

Dec. 17, 1993 [KR] Rep. of Korea .................. 1993-28322

[51] Int. Cl.$^6$ ............................. H04L 27/06; G01S 13/00
[52] U.S. Cl. ............................. 375/344; 342/199; 455/75
[58] Field of Search ........................... 375/344; 342/199, 342/99, 171, 402, 405, 418; 455/75, 136, 164.1; 367/904; 340/544

[56] References Cited

U.S. PATENT DOCUMENTS

| | | | |
|---|---|---|---|
| 2,730,712 | 10/1950 | Dawson | 342/199 |
| 2,852,669 | 11/1954 | Ashby | 342/199 |

FOREIGN PATENT DOCUMENTS 1193674  9/1985  Canada .

OTHER PUBLICATIONS

"Performance Analysis of the Dual–Pilot Tone Calibration Technique", by Christopher P. LaRosa and Todd K. Citron, *IEEE*, 1987, pp. 1445–1450.

"Dual–Pilot Tone Calibration Technique", by Marvin K. Simon, *IEEE*, pp. 63–70.

"AFC Tracking Algorithms", by Francis D. Natali, *IEEE Transactions on Communications*, vol. COM–32, No. 8, Aug. 1984, pp. 935–947.

*Primary Examiner*—Young T. Tse
*Assistant Examiner*—William Luther
*Attorney, Agent, or Firm*—Merchant, Gould, Smith, Edell, Welter & Schmidt

[57] ABSTRACT

The present invention relates to an automatic frequency control device and an automatic gain control device which have the advantage of improving the efficiency of a system with very low signal-to-noise ratio by compensating for frequency error generated at the local oscillator of a satellite or on the receive paths by demodulating the modulated signal continuously sent out from a transmit earth station for transmitting information without using the separate pilot frequency at a receive terminal of a receive earth station and locking at local oscillator of a frequency downconverter to a voltage controlled oscillator tracking an error after detecting a phase error of a carrier by using demodulated data, by compensating the frequency error due to Doppler frequency deviation by locking a local oscillator of a frequency upconverter to a voltage controlled oscillator tracking a phase change according to Doppler frequency deviation included in the clock after recovering the clock from the demodulated data, and by controlling the gain of the variable gain amplifier through the bias restricting the level of peak noise after mean square detecting of demodulated data.

2 Claims, 3 Drawing Sheets

AUTOMATIC FREQUENCY CONTROL DEVICE FOR SATELLITE COMMUNICATIONS GROUND SYSTEM

BACKGROUND OF THE INVENTION

1. Field of the Invention

The present invention relates to an automatic frequency control and automatic gain control devices which are used for a satellite communications system to compensate for frequency error due to frequency instability of an oscillator used for frequency conversion, Doppler frequency deviation caused by movement of the satellite, and a level fluctuation caused by transmission path in radio communications systems such as satellite communications system.

While not limited to such a communication system, the instant invention is directed to the frequency control and level of a central station with respect to many remote stations in point-to-multipoint TDM(Time Division Multiplexing)-TDMA(Time Division Multiple Access) satellite VSAT(Very Small Aperture Terminal) systems.

2. Description of the Prior Art

In satellite communications systems, frequency errors occur due to frequency instability of oscillators used for frequency conversion in an earth station and a transponder, which can deviate frequency acquisition range of a demodulator, as well as give interference to adjacent channels. Furthermore, in satellite communications systems comprised of a central station and several remote stations, to which the present invention is applied, a low cost oscillator is used for the remote station in order to minimize the price of each terminal station in consideration of the economic efficiency of the system, which is synchronized with a reference oscillator with high stability in the central station which generates a transmit frequency. Therefore, a device for compensating for frequency error caused by the Doppler effect is required because it becomes not negligible. Additionally, radio communications systems such as satellite communications, requires an automatic gain control device to keep the input level of the demodulator constant as level fluctuation occurs in the transmission paths.

Many frequency control methods have been used to compensate for frequency errors which occur during a transmission path through satellites. Such conventional methods mainly use one or two pilot frequencies. In Canadian patent No. 1,193,674, entitled, "Two pilot frequency control for communication system," the inventor makes use of two pilot frequencies to compensate for frequency errors introduced during transmission. The invention relates to a method and circuit arrangement for synchronizing the carrier frequency of a reference station with the local oscillator frequency of each of a plurality of remote stations. In this frequency control method, pilot signals of the first frequency and the second frequency are transmitted from a reference station to the remote station, and at the remote station the first filter selects the first frequency and the select filter selects the second frequency. The selected frequencies used to derive the third frequency is related to the difference frequency thereof. Also, the fourth frequency is derived from pilot frequencies and this fourth frequency includes the error frequency introduced during transmission. The third and fourth frequencies are combined so as to derive said frequency control signal for adjusting the frequency of the local oscillator to compensate for said frequency errors.

The conventional frequency control technology, using two pilots, has problems including lowering the efficiency of the satellite system activated and operated with limited bandwidth and power as well as a lower economic efficiency of the system, because the transmit equipment becomes complicated as there must be a separate pilot generation circuit on the transmitter and power and frequency bands are required for transmitting pilots.

In addition, the gain control method, which peak-detects the reference pilot signal level and utilizes it as a negative feedback bias of the variable gain amplifier, has been used in order to compensate for level fluctuation caused by transmission path. This peak detection method has a defect in that the output of the variable gain amplifier is adjusted at a lower level than desired, the signal-to-noise ratio becomes lower and lower, and this can cause the communication to be stopped because the signal detected in the system with the low signal-to-noise ratio becomes the peak value of the noise, and not the desired signal.

SUMMARY OF THE INVENTION

Therefore, the present invention has been made in view of the above problems, and it is an an object of the present invention to provide an automatic frequency control and an automatic gain control device which have the advantages of improving the efficiency in systems with very low signal-to-noise ratio without separate pilot frequency by compensating for frequency error generated on the local oscillator of the satellite and the receive paths by way of demodulating the modulated signals sent out continuously from the transmit earth station at the receiver earth station, detecting the phase error of the carrier using demodulated data and locking the local oscillator of frequency downconverter to the voltage controlled oscillator which tracks the error, by compensating for frequency error due to Doppler frequency deviation by way of locking the local oscillator of the frequency upconverter to the voltage controlled oscillator which tracks the phase change conforming to Doppler frequency deviation included in the clock after recovering the clock from the demodulated data, and by controlling the gain of the variable gain amplifier with the bias limiting the level of peak noise after mean-square-filtering the demodulated data.

To achieve the above object, an automatic gain control device, in accordance with the present invention, is comprised of a mean-square detecting and holding means for detecting levels of both I(Inphase) data and Q(Quadrature) data output from the demodulator, and for holding these levels; a peak-detecting and holding means for detecting a peak of reference voltage applied from the external, and holding the peak of the reference voltage; a summing amplifier means connected to respective outputs of said mean-square detecting means, said peak-detecting and holding means, for making the output voltage according to data levels applied to said mean square detecting and holding means; and an integrating means connected to said summing amplifier means, for providing gain control voltage generated by integrating the output voltage applied from said summing amplifier means to the variable gain amplifier.

Furthermore, an automatic frequency control device, in accordance with the present invention, is comprised of a phase detecting means for detecting the phase differences of the central frequency of a signal applied to the demodulator and a frequency generated by local oscillator by using both I(Inphase) data and Q(Quadrature) data applied from the demodulator; an integrating means connected to said phase detecting means, for generating frequency control voltage by integrating both the phase difference signal applied from said phase detection means and sweep voltage applied from a sweep voltage generation and control means; a control voltage range conversion means for adjusting a central voltage of control voltage applied to a voltage controlled oscillator by converting the control voltage from said integrating means to be made within a control voltage range of the voltage controlled oscillator practically used; said voltage controlled oscillator for generating appropriate frequency according to the control voltage applied from said control voltage range converting means; carrier lock alarm means for detecting a state of lock fixation from the I and Q data; a control voltage limitation alarm means for generating a limitation alarm in order to repeatedly make sweep voltage in case the control voltage applied from said integrating means is out of a predetermined voltage range; and a sweep voltage generation and control means for generating the sweep voltage upon receiving the alarm from said carrier lock alarm means, and for controlling the sweep voltage to be repeated within a predetermined automatic frequency control range.

DETAILED DESCRIPTION OF THE PREFERRED EMBODIMENT

Figure 1:
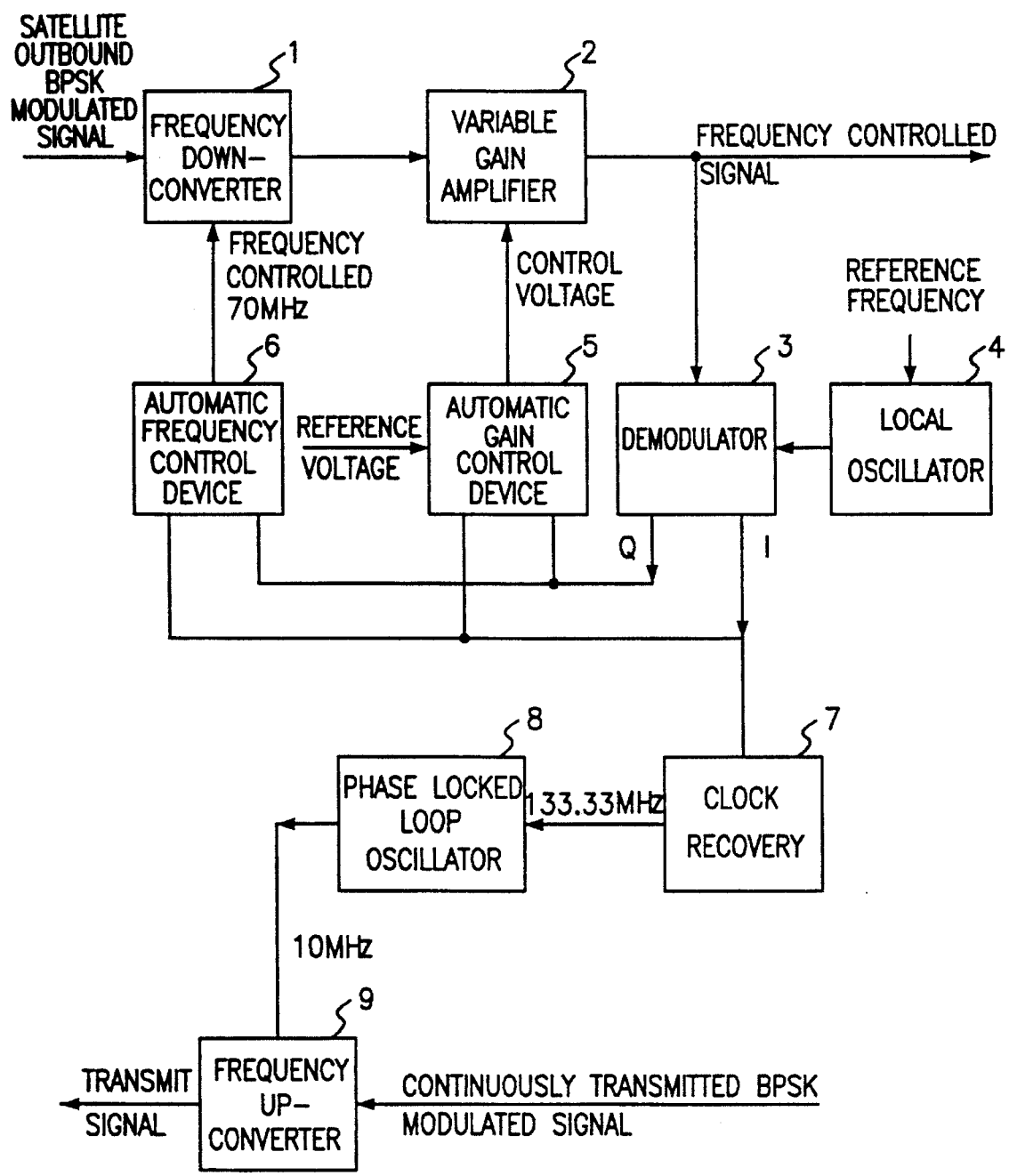
FIG. 1 is a block diagram of the device to which the present invention is applied.

The continuous BPSK(Binary Phase Shift Keying) modulator used for the present invention, is generated from a central earth station and is locked to a system reference frequency with high stability. The BPSK modulated signal is converted into a frequency of 14 GHz band at the frequency upconverter and then converted into a frequency of 12 GHz band at the satellite. The converted signal is returned to the receiver of the central station and converted to the intermediate frequency again at the frequency downconverter, which includes frequency error and level fluctuation occurring during the transmission through the satellite. The following describes only the part related to the devices in accordance with the present invention through an embodiment, as the description of frequency error and level variation occurring on the equipment and transmission paths of a satellite system is generally well-known and is out of the range of the present invention. FIG. 1 is a block diagram of the device to which the present invention is applied.

A frequency downconverter 1 converts the frequency of 12 GHz band received from the satellite to the intermediate frequency of 70 MHz band. Frequency error included in the received 70 MHz signal is compensated for by locking the local oscillator of frequency downconverter to 70 MHz frequency signal received from an automatic frequency control device. Accordingly, the frequency downconverter should be supplied with 70 MHz frequency from the external and the local oscillator should at least have as much change range as error included in the received signal.

A variable gain amplifier 2 keeps the output constant in accordance with the control voltage received from an automatic gain control device after receiving the signal which includes the level variation. A demodulator 3 recovers I and Q baseband signals from the outbound BPSK modulated signal including the frequency error on transmission paths by using the frequency from local oscillator 4 locked to 10 MHz reference frequency.

An automatic gain control device 5 will be described in FIG. 2, which controls the gain of the variable gain amplifier by detecting the signal level of the demodulated data. An automatic frequency control device 6 will be described in FIG. 3, which compensates for frequency error by supplying a local oscillator of frequency downconverter with a difference frequency between a carrier frequency received in the demodulator and a frequency generated by local oscillator 4.

Clock recovery 7 recovers the clock of 133.33 KHz from the demodulated data, which includes Doppler frequency deviation according to 133.33 KHz. A phase locked loop oscillator 8 is an oscillator of 10 MHz that is locked to the input clock frequency, which includes Doppler frequency deviation 75 times 133.33 KHz. A frequency upconverter 9 converts the BPSK-modulated intermediate frequency signal which is continuously transmitting data at 133:33 Kbps used for the present invention to the frequency of 14 GHz band. As the phase locked loop oscillator is locked to 10 MHz, doppler frequency error can be multiplied approximately 1,400 times and then Doppler frequency deviation becomes approximately 500 Hz, if Doppler deviation ratio is 3.6×10E(−8). The central frequency of the transmission signal is then moved as much as 500 Hz and transmitted to a satellite by this frequency.

As a result, the interval between the frequency transmitted from the central station and the frequency transmitted from each earth station remains constant in the frequency spectrum from the viewpoint of the input of the satellite, and the interference phenomenon between channels disappears.

The input of the demodulator is the signal to be used for frequency control, which includes the 500 Hz of Doppler frequency deviation added to the other frequency error. Therefore, this 500 Hz is also compensated for by the automatic frequency control device like the other frequency error.

Accordingly, as the signal whose central frequency is moved as much as 500 Hz by Doppler frequency deviation transmitted from each remote station moves to the correct center after passing through the frequency downconverter 1, the input signal of Demodulator 3 demodulating the signal of each remote station exists at the correct location. Therefore, the demodulator having the very narrow acquisition range within +/−1 KHz can demodulate the signal.

Figure 2:
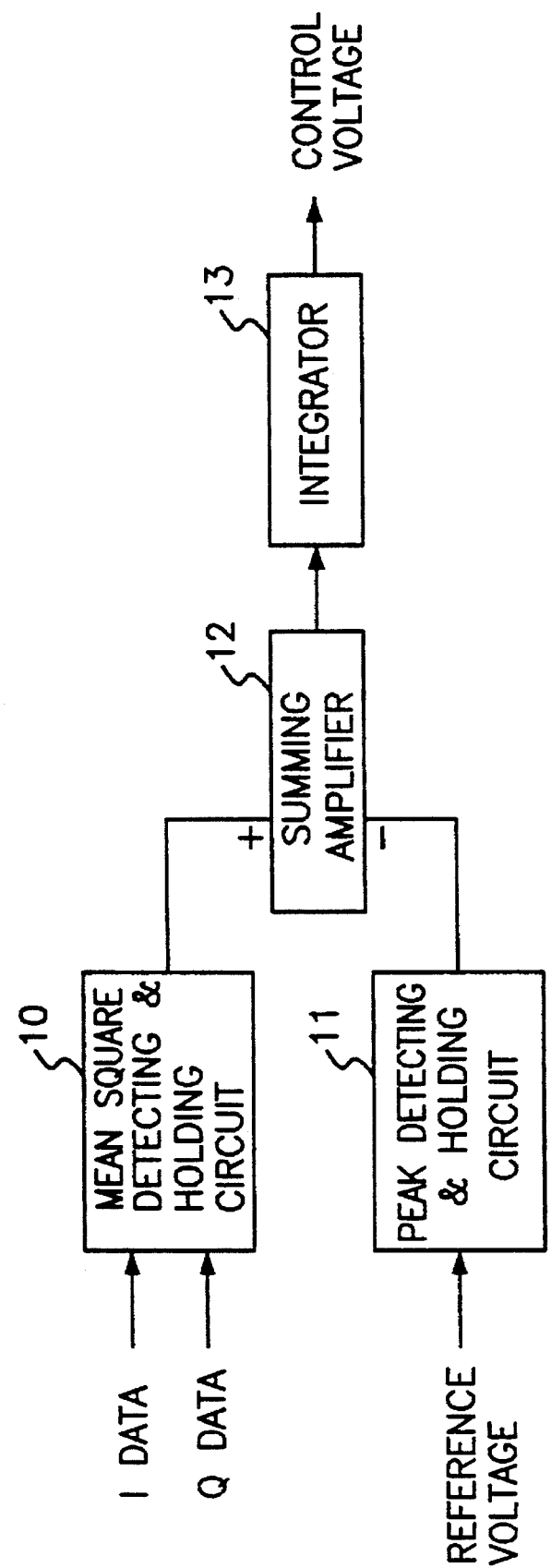
FIG. 2 is a block diagram of an automatic gain control device in accordance with the present invention.

FIG. 2 is a block diagram of an automatic gain control device(5 of FIG. 1) in accordance with the present invention.

A mean square detecting and holding Circuit 10 detects and holds the level of the input I and Q data, and a peak detecting and holding Circuit 11 peak-detects and holds the reference voltage. A summing amplifier 12 which is comprised of OP amps generates the output according to (I+Q)−(2×reference voltage) after being supplied a signal level and a reference voltage through a non-inversion terminal and an inversion terminal. Therefore, the summing amplifier can make the output voltage according to the size of the signal level. An integrator 13 is used for controlling the gain of the variable gain amplifier by integrating the voltage from the summing amplifier 12 and generating the control voltage.

Figure 3:
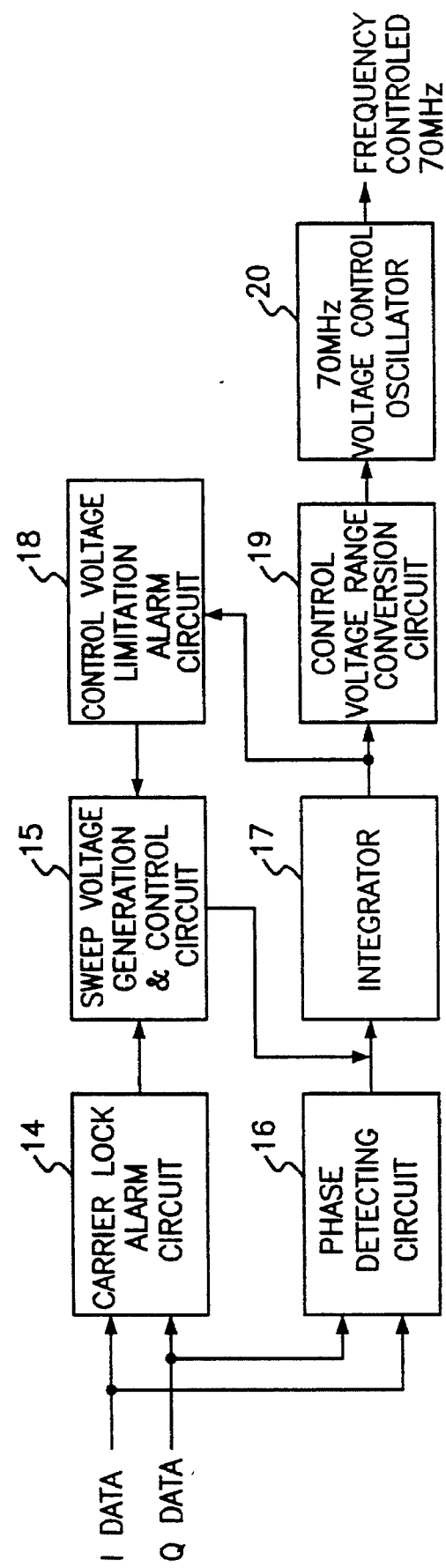
FIG. 3 is a block diagram of an automatic frequency control device in accordance with the present invention.

FIG. 3 is a block diagram of an automatic frequency control device(6 of FIG. 1) in accordance with the present invention.

A phase detecting circuit 16 is a costas loop circuit detecting the phase difference between the central frequency of the input signal of the demodulator 3 of FIG. 1 and the output frequency of the local oscillator 4 from the I, Q data. An integrator 17 generates the control voltage by integrating the phase difference of fine phase detecting circuit 16 and the sweep voltage. A carrier lock alarm circuit 14 generates the alarm when the carrier is not locked after detecting the phase lock state from the I, Q data. A sweep voltage generation and control circuit 15, in case the carrier is not locked, generates the sweep voltage by receiving the alarm signal from the carrier lock alarm circuit 14 and controls the sweep voltage to be repeated within the automatic frequency control range, +/–45 KHz, with a control voltage limitation alarm circuit 18. In case the carrier is locked, the sweep voltage stops because the alarm of the carrier lock alarm circuit 14 disappears. A control voltage limitation alarm circuit 18 makes the repeated sweep voltage generated by generating the limitation alarm when the control voltage gets out of the predetermined voltage range after monitoring the control voltage. A control voltage range conversion circuit 19 converts the voltage of the integrator 17 into the range of the control voltage of the 70 MHz voltage controlled oscillator 20 which adjusts the central voltage of the control voltage. The 70 MHz voltage controlled oscillator 20 generates the appropriate frequency after being supplied the control voltage from the control voltage range conversion circuit 19. This signal is supplied to the frequency downconverter 1, as described in FIG. 1.

Therefore, an automatic frequency control and an automatic gain control device in accordance with the present invention have the effects of reducing the frequency bandwidth by approximately 120 KHz and the electric power by approximately 2 W lost in the conventional method using 2 pilot frequencies, compensating for Doppler frequency deviation of above +/–500 Hz generated when the system comprised of one central station and several terminal stations is synchronized with one central station, and compensating for frequency error of a local oscillator in a satellite and a receiver up to maximum +/–45 KHz. Additionally, an automatic gain control is possible, even under the conditions of very low signal-to-noise ratio, with the mean square detecting demodulated data. Accordingly, the present invention can be utilized for mobile communications systems and digital broadcasting systems in digital transmission methods as well as for satellite communications systems, which can be used to compensate for Doppler frequency deviation whose problem becomes much greater in mobile satellite communications systems to be used in the future.

What is claimed is:

1. An automatic frequency control device of a satellite communications system having a frequency downconverter, a demodulator and a first local oscillator, located at a receiving set of an earth station system, for compensating for frequency error by supplying a second local oscillator of the frequency downconverter with a difference frequency between a carrier frequency received from the demodulator and a first frequency generated by the first local oscillator, comprising;

a phase detecting means for detecting a first phase difference between a central frequency of a signal applied to the demodulator and the first frequency generated by the first local oscillator by using both I(Inphase) data and Q(Quadrature) data applied from the demodulator;

an integrating means connected to said phase detecting means, for generating control voltage by integrating second and third phase differences applied from said phase detecting means and sweep voltage applied from a sweep voltage generation and control means, respectively;

a control voltage range conversion means for adjusting a central voltage of the control voltage as applied to a voltage controlled oscillator by changing the control voltage from said integrating means to be made within a control voltage range of the voltage controlled oscillator;

said voltage controlled oscillator for generating an appropriate second frequency according to the control voltage applied from said control voltage range conversion means;

a carrier lock alarm means for detecting a state of carrier locking from the I and Q data and for generating a first alarm;

a control voltage limitation alarm means for generating a second limitation alarm in order to repeatedly make the sweep voltage in case the control voltage applied from said integrating means is out of a predetermined voltage range; and a sweep voltage generation and control means for generating the sweep voltage upon receiving the first alarm from said carrier lock alarm means and for controlling the sweep voltage to be repeated within a prescribed automatic frequency control range.

2. An automatic frequency control apparatus according to claim 1, wherein said phase detection means comprises a costas loop circuit.

\* \* \* \* \*